United States Patent
Liaw et al.

[11] Patent Number: 6,084,425
[45] Date of Patent: Jul. 4, 2000

[54] APPARATUS FOR ADJUSTING IMPEDANCE OF CONTROLLING CHIP ON A COMPUTER MAINBOARD

[75] Inventors: Yuantsang Liaw, Hsintien; Ching-Fu Chuang, Taipei; Nai-Shung Chang, Yung-Ho, all of Taiwan

[73] Assignee: VIA Technologies, Inc., Taipei, Taiwan

[21] Appl. No.: 09/096,057

[22] Filed: Jun. 11, 1998

[30] Foreign Application Priority Data

Mar. 16, 1998 [TW] Taiwan ................................. 87103816

[51] Int. Cl.$^7$ .................................................. G01R 19/00

[52] U.S. Cl. ............................... 326/30; 326/30; 326/86; 326/21; 326/82; 326/90

[58] Field of Search .................................. 326/30, 82, 86, 326/90, 21

[56] References Cited

U.S. PATENT DOCUMENTS

| 5,894,230 | 4/1999 | Voldman .................................... 326/86 |
| 5,955,889 | 9/1999 | Taguchi et al. ............................ 326/30 |
| 5,955,894 | 9/1999 | Vishwantthaiah et al. ................ 326/86 |

*Primary Examiner*—Michael Tokar
*Assistant Examiner*—Vibol Tan
*Attorney, Agent, or Firm*—Thomas, Kayden, Horstemeyer & Risley

[57] ABSTRACT

An impedance adjusting apparatus of a controlling chip on a computer mainboard. When a computer is turned on, BIOS automatically detects the actual usage of the memory sockets, and then sends corresponding control signals to adjust the impedance of the impedance adjusting apparatus for a better impedance matching between the controlling chip and the memory sockets. The signal reflection is dramatically reduced and the operation bandwidth is widened.

18 Claims, 4 Drawing Sheets

APPARATUS FOR ADJUSTING IMPEDANCE OF CONTROLLING CHIP ON A COMPUTER MAINBOARD

CROSS-REFERENCE TO RELATED APPLICATION

This application claims the priority benefit of Taiwan application serial no. 87103816, filed Mar. 16, 1998, the full disclosure of which is incorporated herein by reference.

BACKGROUND OF THE INVENTION

1. Field of the Invention

This invention relates to a controlling chip, and more particularly, to an apparatus mounted on a computer mainboard that is able to adjust the impedance for a better impedance matching.

2. Description of Related Art

FIG. 1 shows the linkage between a controlling chip and memory sockets in a conventional SSTL DRAM bus. The read/write port 130 in the controlling chip 100 connects to a plurality of memory sockets 101 through transmission line, wherein the transmission line includes address line, data line, and other controlling line. Because currently the signals are transmitted in a relatively high frequency, problems caused by signal reflection and impedance matching accompanying with high frequency signals have to be seriously concerned. Since good impedance matching is the primary condition for minimizing signal reflection, so a design of resistors in series is normally added into the circuit designs for improving impedance matching. Referring to FIG. 1, the read/write port 130 is in series with serial resistor $R_S$ through transmission line 120, wherein the serial resistor $R_S$ can be used as a impedance matching between the read/write port 130 and memory sockets 101a~101d (101a, 101b, 101c, 101d) for reducing reflection in order to prevent signals from distortion. In the other hand, the pull-up resistor $R_T$ is connected to the pull-up voltage source 108a and then connected to the serial resistor $R_S$ through transmission line 140. The voltage delivered by the pull-up voltage source 108a is divided by the pull-up resistor $R_T$ for providing a DC voltage level to clamp signals on the level. Another pull-up resistor $R_T$ connected to pull-up voltage source 108b has a similar function.

As referring to FIG. 1, the serial resistor $R_S$ is also connected to memory sockets 101a~101d as impedance matching between the controlling chip and memory sockets. However, memory sockets 101a~101d may not all be used at the same time in a real world application, in this case, the precision of the impedance matching is affected because the serial resistor $R_S$ cannot be adjusted under the circumstance that different combinations of the usage on the memory sockets. Hence, the value of the serial resistor $R_S$ has to be adjusted according to the actual usage of the memory sockets for keeping the impedance matching precise. In addition, the resistance of the pull-up resistor $R_T$ has to be adjusted according to different usage combination of the memory sockets 101a~101d to prevent the voltage level from shifting. However, since the serial resistor $R_S$ and the pull-up resistor $R_T$ are both fixed resistors whose resistance cannot be adjusted according to the real usage of the memory sockets in a conventional design, the problems caused by impedance matching cannot be efficiently resolved, in addition, the voltage level provided through the pull-up resistor $R_T$ is not precise as well, as a result, the entire performance is seriously worsened.

Because the serial resistor $R_S$ is located outside the controlling chip 100, it has to go through transmission line 120 to connect to the read/write port 130. In order to get a better impedance matching, the serial resistor $R_S$ has to get closer to the controlling chip 100 as possible, that is, the length of the transmission line 120 has to be shorter as possible. However, the currently used packaging technique, such as Tin ball grid array structure, has become the mainstream in this field which is characterized by its massive and compact legs. The controlling chip 100 is surrounded by a massive number of lines that make it more difficult to have the serial resistor $R_S$ close to the controlling chip 100. As a result, the serial resistor $R_S$ and the controlling chip 100 is always separated by a distance of about 1500~2000 mils (1 mil=$10^{-3}$ inch), which affects the precision of the impedance matching.

According to the foregoing, the conventional design brings up at least the following drawbacks:

1. The resistance on the serial resistor cannot be adjusted according to the actual usage of the memory sockets that worsens the impedance and leads to that the precision of signals is worsened;
2. The resistance of the pull-up resistor cannot be adjusted according to the actual usage of the memory sockets that causes the shifting on the voltage level and leads to that the precision of signals is worsened; and
3. Both serial resistors and pull-up resistors are located outside the controlling chip and not close enough to the controlling chip that make the improvement on the signal quality limited.

SUMMARY OF THE INVENTION

It is therefore an objective of the present invention to provide an impedance adjusting apparatus of the controlling chip on a computer mainboard, wherein the impedance adjusting apparatus adjusts the resistance of the serial resistor according to the actual usage of memory sockets to improve the impedance matching between the controlling chip and memory sockets, and reduce the effect of signal reflection for improving the reliability of transmitted signals.

It is another an objective of the present invention to provide an impedance adjusting apparatus of the controlling chip on a computer mainboard, wherein the impedance adjusting apparatus adjusts the resistance of the pull-up resistor according to the actual usage of memory sockets to prevent the voltage level from shifting for improving the reliability of transmitted signals.

It is still another objective of the present invention to provide an impedance adjusting apparatus of the controlling chip on a computer mainboard, wherein the impedance adjusting apparatus locates both the serial resistor and pull-up resistor within the controlling chip for improving the reliability of transmitted signals.

In accordance with the foregoing and other objectives of the present invention, the present invention provides an impedance adjusting apparatus to match the transmission impedance between the read/write port within the controlling chip and memory sockets, and provide a DC voltage level required by signals, according to the actual usage of memory sockets. The impedance adjusting apparatus according to the present invention includes a serial rheostat and a pull-up rheostat, wherein the serial rheostat is used for impedance matching, and the pull-up rheostat is connected in series with the pull-up voltage source to provide a required DC voltage level.

The serial rheostat includes a plurality of serial resistors connected in series, wherein each serial resistor is in parallel with an electronic switch. When the electronic switch is on, the serial resistor connected in parallel with the electronic switch is shorted, inversely, the serial resistor is not affected by the electronic switch if the electronic switch connected in parallel with the serial resistor is off. Hence, as a whole, the equivalent resistance of the serial rheostat is controlled by the electronic switches. By using a proper design, the impedance adjusting apparatus sends a proper control signal according to the actual usage of memory sockets to control the electronic switches for matching the transmission impedance between the controlling chip and memory sockets precisely. A similar structure is employing in the circuit for the pull-up rheostat for adjust the resistance of the pull-up rheostat according to the actual usage of memory sockets, so that a stable DC bias is obtained no matter how the memory sockets are used.

In the other hand, instead of using resistors, the serial rheostat and pull-up rheostat is also possible to present in the form of transistors. By selecting proper field effect transistors (FET) or metal oxide semiconductor field effect transistors (MOSFET), and feeding different reference voltages to the gates of transistors, the conductivity of transistors can be adjusted, so that those transistors can be used as variable resistors. The function of the serial rheostat and pull-up resistor can be achieved by controlling the values of reference voltages to adjust the resistance of those transistors.

After a computer is turned on, the BIOS (base Input Output System) detects the actual usage of memory sockets, wherein the detected information is used as a reference for sending proper control signals or reference voltages to adjust the resistance of the serial rheostat and pull-up rheostat for keeping a good impedance matching and clamping the transmitted signals on a fixed voltage level.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
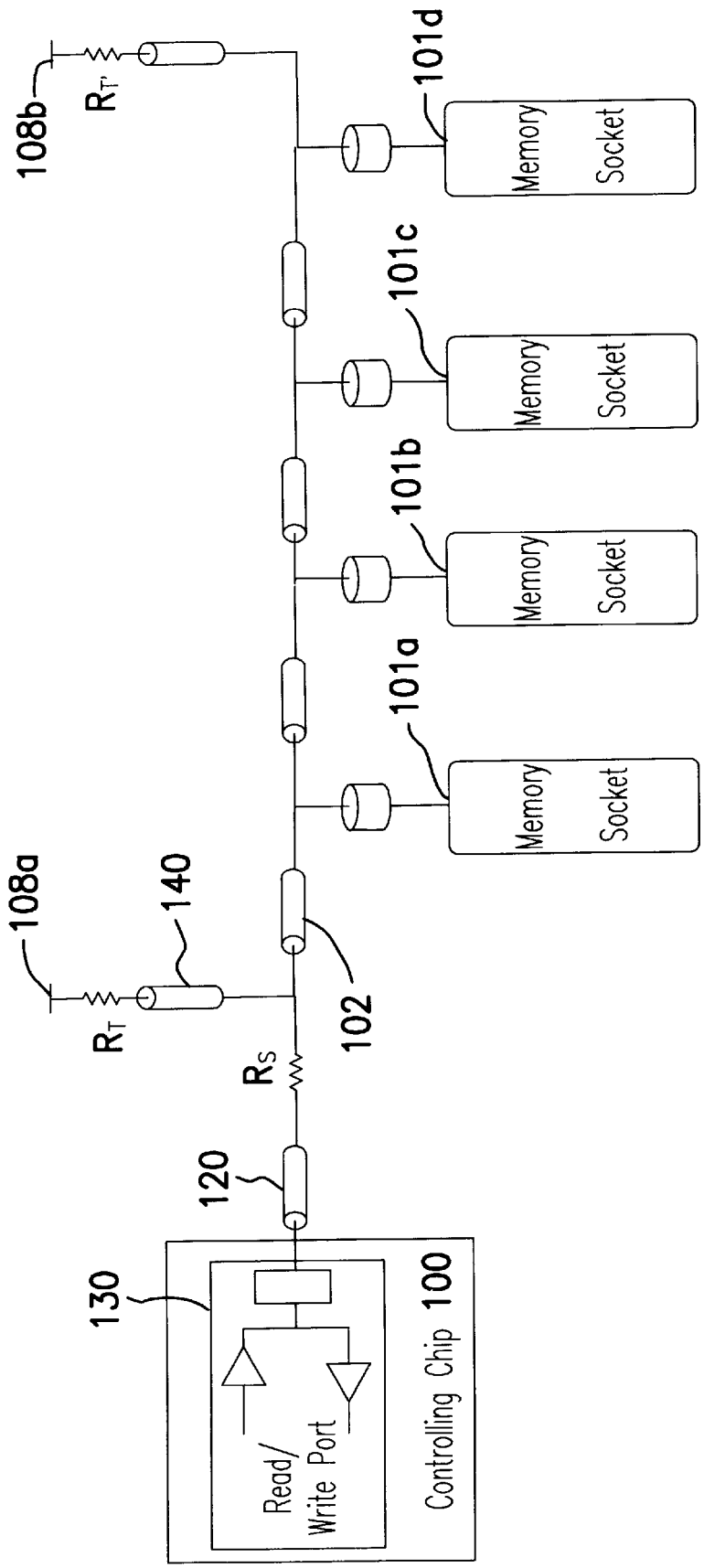
FIG. 1 is a schematic block diagram showing the linkage between controlling chip and memory sockets in a conventional SSTL DRAM bus.
Figure 2A:
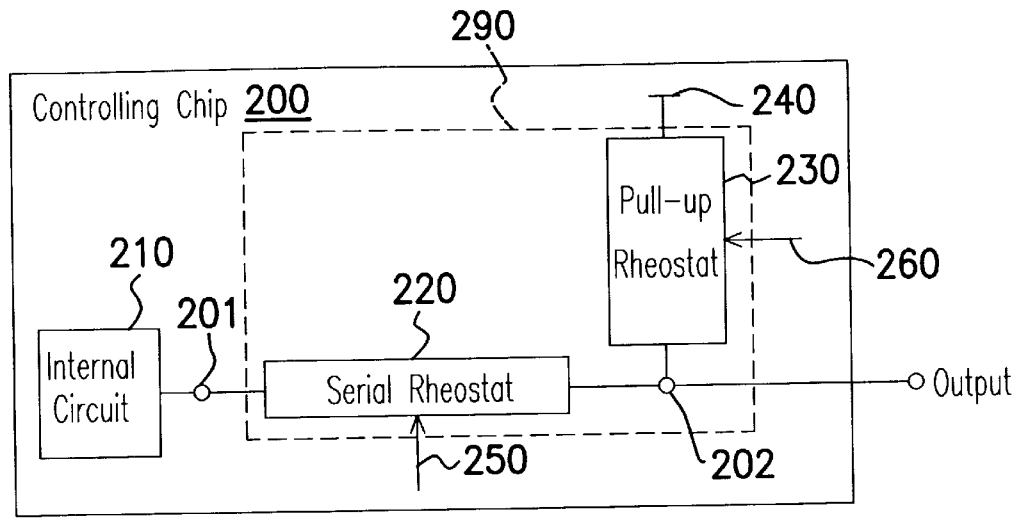
FIG. 2A is a diagram showing an impedance adjusting apparatus in a preferred embodiment according to the present invention.

Referring to FIG. 2A, which shows an impedance adjusting apparatus 290 in a preferred embodiment according to the present invention, an impedance adjusting apparatus 290 includes a serial rheostat 220 and a pull-up rheostat 230 built-in within the controlling chip 200 and connected to a internal circuit 210, a pull-up voltage source 240 and a output end respectively. The serial rheostat 220 has a first connecting end 201 connected to the internal circuit 210, and a second connecting end 202 connected to the output end. The output end is connected to a transmission line 102 in FIG. 1 for writing data into or reading data from the memories (not shown) plugged into the memory sockets 101a~101d. The impedance between the controlling chip 200 and the memory sockets 101a~101d stays matched by the presence of the serial rheostat 220. The pull-up rheostat 230 has one end connected to the pull-up voltage source 240 and the other end connected to the second connecting end 202. The DC voltage bias at the output end can remain in a fixed voltage level by using the pull-up rheostat as a voltage divider.

The primary function of the serial rheostat 220 is used to keep the impedance matching between the controlling chip 200 and memory sockets 101a~101d. In a real world application, the resistance of the serial rheostat 220 is controlled by a serial control signal 250 according to the actual usage of the memory sockets 101a~101d to make the impedance matching between the controlling chip 200 and memory sockets 101a~101d perfect. The primary function of the pull-up rheostat 230 is to provide a stable DC bias by dividing the voltage sent from the pull-up voltage source. In a real world application, the resistance of the pull-up rheostat 230 is controlled by a fed signal 260 according to the actual usage of the memory sockets 101a~101d for clamping the transmitted signals on a predetermined voltage level without shifting due to different usage of the memory sockets.

Figure 2B:
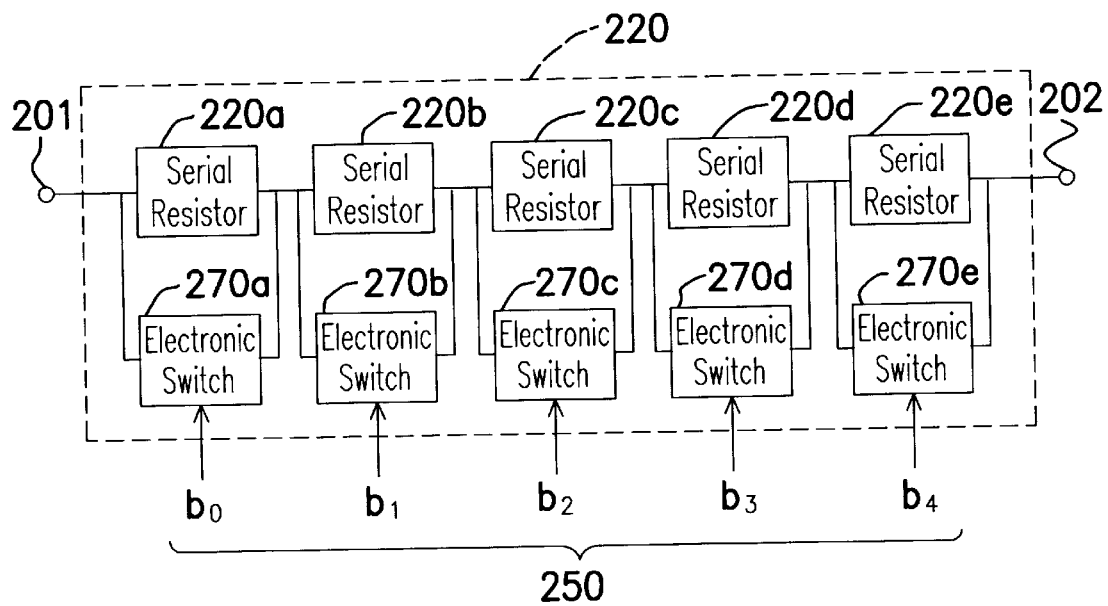
FIG. 2B is a diagram showing the detail structure of the serial rheostat 220 as shown in FIG. 2A.

Referring to FIG. 2B, which shows the detail structure of the serial rheostat 220 shown in FIG. 2A, the serial rheostat 220 includes a first connecting end 201, a second connecting end 202, serial resistors 220a~220e (220a, 220b, 220c, 220d, 220e), and electronic switches 270a~270e (270a, 270b, 270c, 270d, 270e), wherein the serial resistors 220a~220e are in series in sequence, and each of them are in parallel with a corresponding electronic switch respectively. The statuses of electronic switches 270a~270e are controlled by control bits $b_0$~$b_4$ which are control bits within the serial control signal 250. In other words, the serial control signal consists of five control bits $b_0$, $b_1$, $b_2$, $b_3$, $b_4$ for controlling the statuses of the electronic switches 270a~270e to determine the equivalent resistance of the serial rheostat. For example, when a control bit has a value of logic 1 which makes the electronic switch closed and the corresponding serial resistor is then shorted; when a control bit has a value of logic 0 which makes the electronic switch opened and the corresponding serial resistor is then unaffected, wherein the serial resistors 270a~270e include transistors, FETs, MOSFETs, or any other devices having the similar functions. Under this circumstance, the equivalent resistance is determined by just changing the control bits of the serial control signal 250. Furthermore, the resistance on each of the serial resistors 220a~220e are not necessary to be the same, they can be any properly selected values according to the actual requirements for achieving the impedance matching easily.

Referring to Table 1, the values of control bits versus the corresponding resistance of serial rheostat, wherein each of the serial resistors within the serial rheostat having a resistance of 10 Ω are selected as an example for describing the present invention.

TABLE 1

| $b_0$ | $b_1$ | $b_2$ | $b_3$ | $b_4$ | Resistance of the variable serial resistor |
|---|---|---|---|---|---|
| 0 | 0 | 0 | 0 | 0 | 50 Ω |
| 1 | 0 | 0 | 0 | 0 | 40 Ω |
| 1 | 1 | 0 | 0 | 0 | 30 Ω |
| 1 | 1 | 1 | 0 | 0 | 20 Ω |
| 1 | 1 | 1 | 1 | 0 | 10 Ω |
| 1 | 1 | 1 | 1 | 1 | 0 Ω |

Figure 2C:
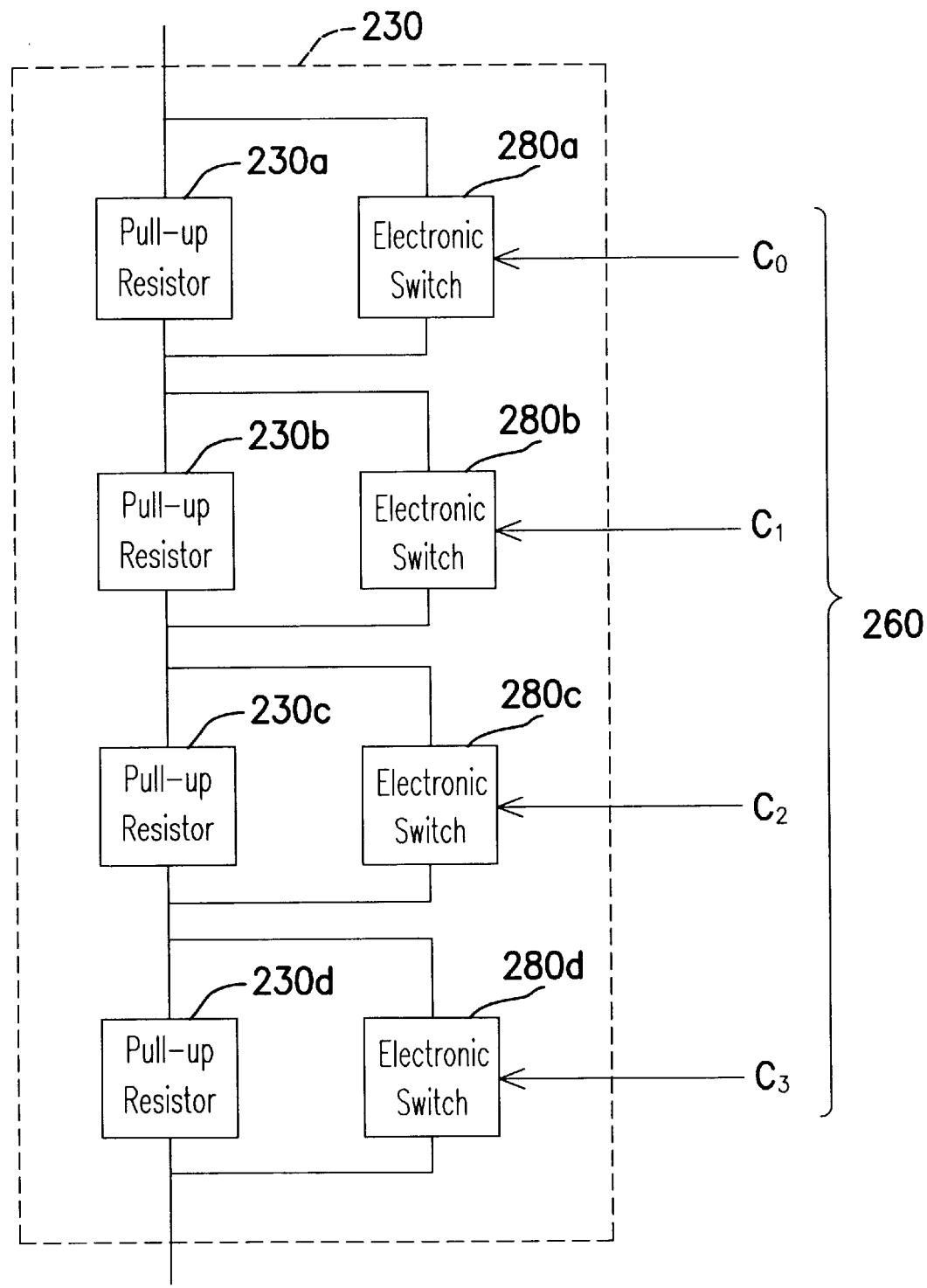
FIG. 2C is a diagram showing the detail structure of the pull-up rheostat 230 as shown in FIG. 2A.

Referring to FIG. 2C which shows the detail structure of the pull-up rheostat 230 shown in FIG. 2A, the pull-up rheostat 230 includes pull-up resistors 230a~230d (230a, 230b, 230c, 230d), and electronic switches 280a~280d (280a, 280b, 280c, 280d), wherein the pull-up resistors 230a~230d are in series in sequence, and each of them are in parallel with a corresponding electronic switch respectively. The statuses of electronic switches 280a~280d are controlled by control bits $c_0$~$c_3$ which are control bits within the pull-up control signal 260. In other words, the pull-up control signal consists of four control bits $b_0$, $b_1$, $b_2$, $b_3$ for controlling the statuses of the electronic switches 280a~280d to determine the equivalent resistance of the pull-up rheostat. For example, when a control bit has a value of logic 1 which makes the electronic switch closed and the corresponding pull-up resistor is then shorted; when a control bit has a value of logic 0 which makes the electronic switch opened and the corresponding pull-up resistor is then unaffected, wherein the pull-up resistors 230a~230d include transistors, FETs, MOSFETs, or any other devices having the similar functions. Under this circumstance, the equivalent resistance is determined by just changing the control bits of the pull-up control signal 260. Furthermore, the resistance on each of the pull-up resistors 230a~230d are not necessary to be the same, they can be any properly selected values according to the actual requirements for achieving the impedance matching easily.

Referring to Table 1, the values of control bits versus the corresponding resistance of serial rheostat, wherein each of the serial resistors within the serial rheostat having a resistance of 10 Ω are selected as an example for describing the present invention.

Referring to Table 2, the values of control bits versus the corresponding resistance of pull-up rheostat, wherein the pull-up resistors 230a, 230b, and 230c having a resistance of 20 Ω, and 230d having a resistance of 10 Ω are selected as an example for describing the present invention.

TABLE 2

| $c_0$ | $c_1$ | $c_2$ | $c_3$ | Resistance of the pull-up rheostat |
|---|---|---|---|---|
| 0 | 0 | 0 | 0 | 70 Ω |
| 1 | 0 | 0 | 0 | 50 Ω |
| 1 | 1 | 0 | 0 | 30 Ω |
| 1 | 1 | 0 | 0 | 40 Ω |
| 0 | 0 | 1 | 1 | 60 Ω |

The information about the serial control signal and the pull-up control signal are stored in the register (not shown) within the controlling chip 200. As soon as the computer is turned on, BIOS firstly detects the actual usage of the memory sockets automatically, and modifies the information about the control signals previously stored in the register by using the newly detected information, so that the proper control signals can be used to adjust the resistance on the serial rheostat and the pull-up rheostat for maintaining the impedance matching and clamping the transmitted signals on a fixed voltage level. It is not against the spirit of the present invention to read or write the information about the control signals from or into the register by program. The number and resistance of the serial resistors and pull-up resistors are not limited by the described examples, so any proper modifications made by people who is skilled in this art to make, is still not against the spirit of the present invention. Automatically detecting the actual usage of the memory sockets and adjusting the resistance of the serial rheostat and pull-up rheostat is one of the important technical characteristics of the present invention.

Figure 3:
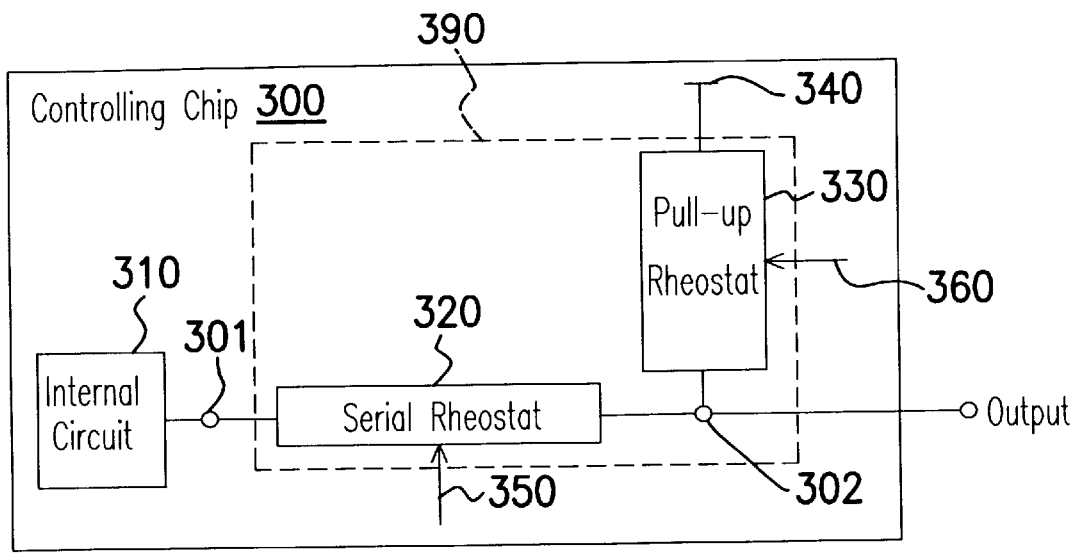
FIG. 3 is a diagram showing another impedance adjusting apparatus in another preferred embodiment according to the present invention.

Another preferred embodiment, which provides another impedance adjusting apparatus 390, according to the present invention is shown in FIG. 3. The impedance adjusting apparatus 390 includes serial rheostat 320 and pull-up rheostat 330 which are built in the controlling chip 300, and connect to the internal circuit 310, pull-up voltage source, and output end within the controlling chip 300 respectively. The serial rheostat 320 includes a first connecting end 301 and a second connecting end 302, wherein the first connecting end 301 connects to the internal circuit 310, and the second connecting end connects to the output end. The output end connects to the transmission line 102 shown in FIG. 1 for reading or writing data from or to the memories (not shown) installed in the memory sockets 101a~101d. The impedance matching between the controlling chip 300 and the memory sockets 101a~101d remains match by the presence of the serial rheostat 320. The pull-up rheostat 330 connects to the pull-up voltage source 340 through one end, and connects to the second connecting end 302 through the other end. Under a proper design, the pull-up rheostat 330 works as a voltage divider for providing a fixed voltage level.

The primary function of the serial rheostat 320 is used to keep the impedance matching between the controlling chip 300 and memory sockets 101a~101d. In a real world application, the resistance of the serial rheostat 320 is controlled by a fed serial reference voltage 350 according to the actual usage of the memory sockets 101a~101d to make the impedance matching between the controlling chip 300 and memory sockets 101a~101d perfect. The primary function of the pull-up rheostat 330 is to provide a stable DC bias by dividing the voltage sent from the pull-up voltage source. In a real world application, the resistance of the pull-up rheostat 330 is controlled by a fed pull-up reference voltage 360 according to the actual usage of the memory sockets 101a~101d for clamping the transmitted signals on a predetermined voltage level without shifting due to different usage of the memory sockets.

Figure 4:
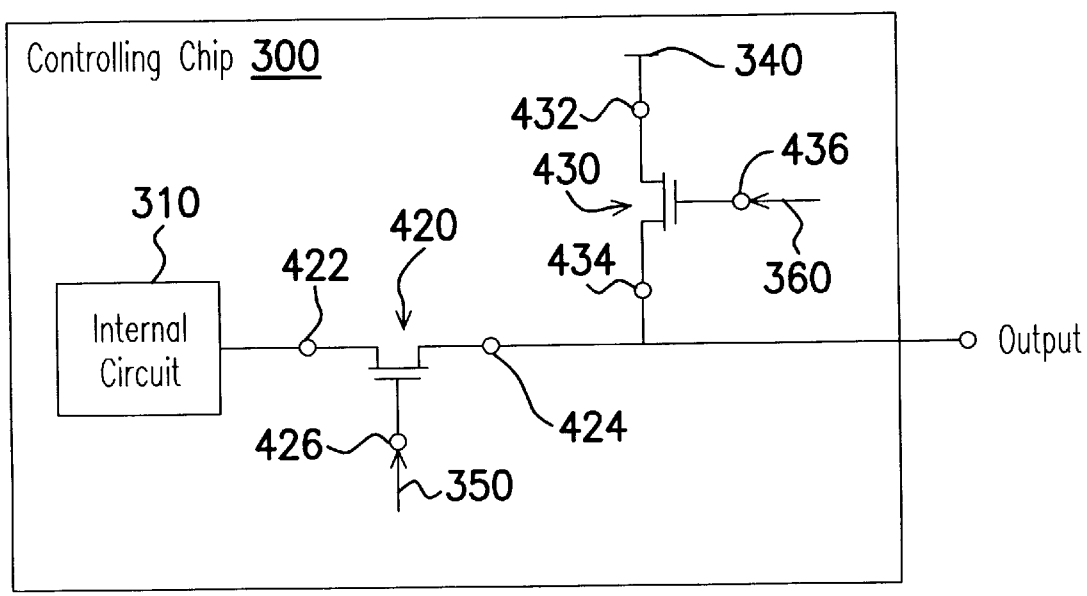
FIG. 4 is a diagram showing the achievement of the circuit scheme shown in FIG. 3 by employing transistors.

Referring to FIG. 4 which shows another embodiment according to the present invention that uses transistors instead of resistors in the circuit shown in FIG. 3, the serial transistor 420 including a first connecting end 422, a second connecting end 424 and a gate 426 is used for remaining a impedance matching, wherein the first connecting end 422 is in series with the drain of the transistor 420, and the second connecting end 424 is in series with the source of the transistor 420. The first connecting end 422 then connects to the internal circuit 410 and the second connecting end 424 connects to the output end. A serial reference voltage 350 is fed into the gate 426 of the transistor 420 for controlling the conductivity of the serial transistor 420, wherein the serial transistor 420 includes a FET, a MOSFET, or other similar devices. Under this circumstance, the equivalent resistance of the serial transistor 420 can be adjusted by just modifying voltage level of the serial reference voltage 350.

Pull-up transistor 430 is used as a voltage divider for dividing the voltage from the pull-up voltage source 340 to provide a DC voltage level for clamping the transmitted signals on the level. To achieve the objective hereinbefore, the drain 432 of the pull-up transistor 430 connects to the pull-up voltage source 340 of the pull-up transistor 430, and the source 434 connects to the second connecting end 424. A pull-up reference voltage 360 is fed into the gate 436 of the pull-up transistor 430 for controlling the conductivity of the pull-up transistor 430, wherein the pull-up transistor 430 includes a FET, a MOSFET, or other similar devices. The equivalent resistance of the pull-up resistor 430 can be adjusted by controlling the pull-up reference voltage 360. The DC voltage bias at the output end is fixed on a predetermined voltage level by using the pull-up transistor 430 as a voltage divider.

When a computer is turned on, BIOS automatically detects the actual usage of the memory sockets,, and uses the detected information about the memory sockets to determine the needed serial reference voltage 350 and pull-up reference voltage 360. The serial reference voltage 350 and pull-up reference voltage 360 are then fed into the serial transistor 420 and pull-up transistor 430 respectively to adjust the equivalent resistance of those two transistors for keeping the impedance matching and clamping the transmitted signals on a fixed voltage level.

Referring to Table 3, a relationship between a reference voltage and the corresponding transistor's equivalent voltage is listed.

TABLE 3

| Reference Voltage | Equivalent resistance of Transistor |
|---|---|
| 0.5 V | 68 Ω |
| 0.65 V | 40 Ω |
| 0.7 V | 30 Ω |
| 0.8 V | 20 Ω |
| 0.9 V | 10 Ω |

According to the foregoing, the present invention has at least the following advantages over the conventional design:

1. The reliability of the transmitted signals is improved because the resistance of the serial resistor is adjusted according to the actual usage of the memory sockets, the impedance matching between the controlling chip and the memory sockets remains good, and the signal reflection is dramatically reduced.
2. The reliability of the transmitted signals is improved, because the resistance of the pull-up resistor is adjusted according to the actual usage of the memory sockets, the voltage level is protected from shifting due to a different usage of the memory sockets.
3. The quality of transmitted signals are improved because the serial resistor and pull-up resistor are built into the controlling chip.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An impedance adjusting apparatus of a controlling chip on a computer mainboard, wherein the controlling chip comprises an output end, a pull-up voltage source, and an internal circuit, the apparatus comprises:
    a serial rheostat, including a first connecting end and a second connecting end, wherein the first connecting end connects to the internal circuit, and the second connecting end connects to the output end, wherein an impedance of the serial rheostat is determined by a serial control signal; and
    a pull-up rheostat, connected to the second connecting end through one end and connects to the pull-up voltage source through the other end, wherein an impedance of the pull-up rheostat is determined by a pull-up control signal.

2. The apparatus of claim 1, wherein the serial rheostat includes a plurality of serial resistors, wherein the serial resistors are in series, and each of the serial resistors is in parallel with a corresponding electronic switch, wherein statuses of the electronic switches are determined by the serial control signal.

3. The apparatus of claim 1, wherein the pull-up rheostat a plurality of pull-up resistors, wherein the pull-up resistors are in series, and each of the pull-up resistors is in parallel with a corresponding electronic switch, wherein statuses of the electronic switches are determined by the pull-up control signal.

4. The apparatus of claim 3, wherein the output end connects to a plurality of memory sockets, an actual usage of the memory sockets determined the serial control signal.

5. The apparatus of claim 3, wherein the output end connects to a plurality of memory sockets, an actual usage of the memory sockets determined the pull-up control signal.

6. The apparatus of claim 3, wherein the switches include transistors.

7. The apparatus of claim 3, wherein the switches include field effect transistors.

8. The apparatus of claim 3, wherein the switches include metal oxide semiconductor field effect transistors.

9. An impedance adjusting apparatus of a controlling chip on a computer mainboard, wherein the controlling chip comprises an output end, a pull-up voltage source, and an internal circuit, the apparatus comprises:
    a serial rheostat, including a first connecting end and a second connecting end, wherein the first connecting end connects to the internal circuit, and the second connecting end connects to the output end, wherein an impedance of the serial rheostat is determined by a serial reference voltage; and
    a pull-up rheostat, connected to the second connecting end through one end and connects to the pull-up voltage source through the other end, wherein an impedance of the pull-up rheostat is determined by a pull-up reference voltage.

10. The apparatus of claim 9, wherein the output end connects to a plurality of memory sockets, an actual usage of the memory sockets determined the serial reference voltage.

11. The apparatus of claim 9, wherein the output end connects to a plurality of memory sockets, an actual usage of the memory sockets determined the pull-up reference voltage.

12. The apparatus of claim 9, wherein the serial rheostat includes metal oxide semiconductor field effect transistor.

13. The apparatus of claim 9, wherein the pull-up rheostat includes metal oxide semiconductor field effect transistor.

14. An impedance adjusting apparatus of a controlling chip on a computer mainboard, wherein the controlling chip comprises an output end, a pull-up voltage source, and an internal circuit, the apparatus comprises:

- a serial transistor, includes a gate, a first connecting end and a second connecting end, wherein the first connecting end connects to the internal circuit, and the second connecting end connects to the output end, wherein an impedance of the serial transistor is determined by a serial reference voltage fed into the gate; and
- a pull-up transistor, connects to the second connecting end through a source region and connects to the pull-up voltage source through a drain region, wherein an impedance of the pull-up transistor is determined by a pull-up reference voltage fed into a gate of the pull-up transistor.

15. The apparatus of claim 14, wherein the output end connects to a plurality of memory sockets, an actual usage of the memory sockets determined the serial reference voltage.

16. The apparatus of claim 14, wherein the output end connects to a plurality of memory sockets, an actual usage of the memory sockets determined the pull-up reference voltage.

17. The apparatus of claim 14, wherein the first connecting end connects to a source region of the serial transistor, and the second connecting end connects to a drain region of the serial transistor.

18. The apparatus of claim 14, wherein the first connecting end connects to a drain region of the serial transistor, and the second connecting end connects to a source region of the serial transistor.

* * * * *